US011290059B2

(12) United States Patent
Yong et al.

(10) Patent No.: US 11,290,059 B2
(45) Date of Patent: *Mar. 29, 2022

(54) CRYSTAL OSCILLATOR INTERCONNECT ARCHITECTURE WITH NOISE IMMUNITY

(71) Applicant: Intel Corporation, Santa Clara, CA (US)

(72) Inventors: Khang Choong Yong, Puchong (MY); Raymond Chong, Bayan Baru (MY); Ramaswamy Parthasarathy, Bangalore (IN); Stephen Hall, Forest Grove, OR (US); Chin Lee Kuan, Bayan Lepas (MY)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/714,390

(22) Filed: Dec. 13, 2019

(65) Prior Publication Data

US 2020/0274491 A1    Aug. 27, 2020

Related U.S. Application Data

(63) Continuation of application No. 16/237,093, filed on Dec. 31, 2018, now Pat. No. 10,516,366, which is a (Continued)

(51) Int. Cl.
*H03B 5/32*  (2006.01)
*H03L 7/06*  (2006.01)

(52) U.S. Cl.
CPC ............... *H03B 5/32* (2013.01); *H03L 7/06* (2013.01); *H03B 2200/0088* (2013.01)

(58) Field of Classification Search
CPC ... H03B 5/30; H03B 5/32; H03B 5/36; H03B 5/34; H03B 5/362; H03B 5/364;
(Continued)

(56) References Cited

U.S. PATENT DOCUMENTS 5,734,302 A * 3/1998 Teng ............... H03C 3/0941
331/2
5,801,594 A * 9/1998 Muto ............... H03L 1/025
331/158

(Continued)

OTHER PUBLICATIONS

Final Office Action dated Jul. 20, 2018 for U.S. Appl. No. 15/469,499.
(Continued)

*Primary Examiner* — Levi Gannon
(74) *Attorney, Agent, or Firm* — Schwabe, Williamson & Wyatt, P.C.

(57) ABSTRACT

An apparatus is provided which comprises: a crystal having an input and an output; a first interconnect line having first and second ends, wherein the first end is coupled to the input; a second interconnect line having first and second ends, wherein the first end is coupled to the output; a first capacitor coupled to the input and ground; and a second capacitor coupled to the second end of the second interconnect line. An apparatus is provided which comprises: a high pass filter; a pair of AC coupling capacitors coupled to the high pass filter; a low pass filter coupled to the pair of AC coupling capacitors; and an analog to digital converter (ADC) coupled to the low pass filter.

17 Claims, 8 Drawing Sheets

Related U.S. Application Data continuation of application No. 15/469,499, filed on Mar. 25, 2017, now Pat. No. 10,171,033.

(60) Provisional application No. 62/417,216, filed on Nov. 3, 2016.

(58) Field of Classification Search
CPC ................... H03B 5/366; H03B 5/368; H03B 2200/0088; H03K 5/1252; H04B 15/04; H04L 25/085; H04L 25/04; H04L 25/0405; H04L 25/0466; H04L 25/1213; H04L 25/1204; H04L 25/1291; H03H 11/04; H03H 11/0405; H03H 11/0466; H03H 11/1213; H03H 11/1204; H03H 11/1291; H03H 7/12; H03H 7/1708; H03G 3/10; H03G 3/20; H03G 3/3052; H03G 3/3063; H03L 7/06
USPC .................................................. 331/154, 158
See application file for complete search history.

(56) References Cited

U.S. PATENT DOCUMENTS

| | | | | |
|---|---|---|---|---|
| 5,844,448 A * | 12/1998 | Jackoski | ................ | H03K 3/014 331/158 |
| 5,982,248 A * | 11/1999 | Wagner | ................ | H03K 3/0307 331/108 B |
| 6,150,898 A | 11/2000 | Kushitani | | |
| 6,512,472 B1 * | 1/2003 | Smith | ................... | H03M 1/129 341/155 |
| 6,927,641 B2 * | 8/2005 | Terasawa | ............. | H03K 3/0307 331/116 R |
| 7,109,813 B2 | 9/2006 | Pan | | |
| 7,342,460 B2 | 3/2008 | Batchelor et al. | | |
| 7,391,257 B1 | 6/2008 | Denison et al. | | |
| 7,724,101 B2 | 5/2010 | Guerreiro | | |
| 8,957,745 B2 | 2/2015 | Liu | | |
| 9,281,781 B2 | 3/2016 | Ozawa | | |
| 9,306,609 B1 | 4/2016 | Lacroix | | |
| 2001/0017574 A1 * | 8/2001 | Oka | ........................ | H03L 1/023 331/116 R |
| 2005/0243657 A1 * | 11/2005 | Nagata | .................... | H02M 1/36 368/204 |
| 2012/0176763 A1 * | 7/2012 | Asamura | ................. | H03L 1/028 361/820 |
| 2014/0210565 A1 * | 7/2014 | Vilas Boas | ............ | H03B 5/364 331/158 |
| 2016/0028405 A1 * | 1/2016 | Caffee | ..................... | H03L 1/026 331/66 |

OTHER PUBLICATIONS

Non-Final Office Action for U.S. Appl. No. 15/469,499, dated Feb. 8, 2018.
Notice of Allowance dated Aug. 14, 2019 for U.S. Appl. No. 16/237,093.
Notice of Allowance dated Sep. 12, 2018 for U.S. Appl. No. 15/469,499.

\* cited by examiner

CRYSTAL OSCILLATOR INTERCONNECT ARCHITECTURE WITH NOISE IMMUNITY

CLAIM OF PRIORITY

This application is a Continuation of, and claims priority to U.S. patent application Ser. No. 16/237,093, filed Dec. 31, 2018, and titled, "Crystal Oscillator Interconnect Architecture with Noise Immunity," and issued as U.S. Pat. No. 10,516,366, on Dec. 24, 2019, which is a Continuation of, and claims priority to U.S. patent application Ser. No. 15/469,499, filed Mar. 25, 2017, and issued as U.S. patent Ser. No. 10/171,033 on Jan. 1, 2019, and titled, "Crystal Oscillator Interconnect Architecture with Noise Immunity," which claims priority of U.S. Provisional Application No. 62/417,216 filed Nov. 3, 2016, all of which are incorporated by reference in entirety.

BACKGROUND

Package and board level noise (e.g., platform noise) coupled into the crystal oscillator (XO) interconnect has been identified as the dominant factor contributing to a jittery system clock, and is significant enough to cause system functional failures in processor systems (e.g. Display flickering issue in due to noise coupling from Universal Serial Bus (USB3) and Power/ground planes, and system instability due to noise coupling from inductive components carrying high switching current). This issue will become more problematic in future computing platforms as system performance scales, bus speeds increase, and form factors shrink. If this issue is not properly mitigated, it may complicate system designs, compromise system performance and possibly lead to product recalls for future systems due to platform level functional failures.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
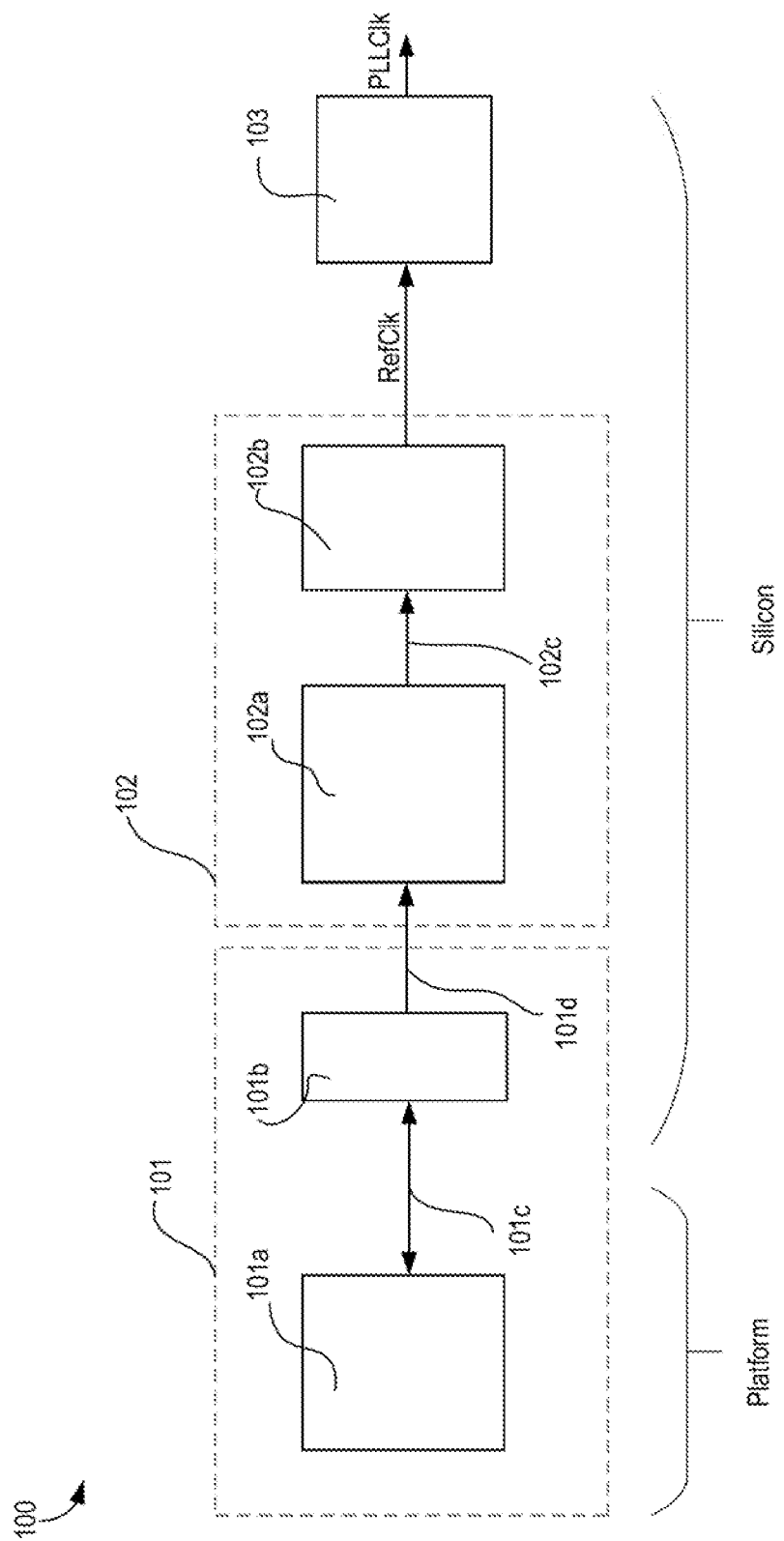
FIG. 1 illustrates a bandpass XO architecture, according to some embodiments of the disclosure.

Typical noise isolation techniques, such as to enforce less than −60 dB signal-to-noise isolation with vertical and horizontal ground shielding, avoid XO routing close to high-speed signals and noisy power/ground plane/via. These typical noise isolation techniques trade off board/package real estate with layer count. As such, it may become impractical to achieve board/package design miniaturization using this noise isolation technique. Another typical noise isolation technique, such as to increase oscillator amplifier gain, implements active noise compensation or filtering circuitry and relies solely on additional low noise phase locked loop (PLL) loop filter. This technique trades off cost, power, XO performance (e.g., impact on oscillator Q-factor, reference clock parts per million (ppm) and settling/build-up time), and as such, increases the overall design complexity of the clocking architecture.

Various embodiments significantly reduce the risk of future platform level functional failures in computing systems by reducing the noise coupled into the crystal oscillator circuitry. Some embodiments introduce a new crystal oscillator interconnect architecture with robust wideband platform noise suppression at minimal overhead in terms of overall cost, power, and performance.

There are many technical effects of the various embodiments. For example, the bandpass architecture of some embodiments may reduce output clock jitter contributed by the platform noise coupled to the XO interconnect for noise frequency. For instance, the output clock jitter may reduce by greater than 40% for noise frequency that may be as low as less than 10 MHz to as high as greater than 50 MHz, with overall less than 0.1% growth in die footprint/cost, less than 0.1% increase in power, less than 1% duty cycle shift, and less than 0.1% build-up time increase. Various embodiments may make it easier for customers to design systems around silicon (e.g., processors and other integrated circuit chips) and facilitate package/board design miniaturization by allowing less stringent layout routing constraints (e.g. typical architectures use 10× spacing isolation from noise sources while the various embodiments result in 3× spacing isolation from noise sources). Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 1 illustrates a bandpass XO architecture 100, according to some embodiments of the disclosure. Architecture 100 comprises a feedback linear oscillator 101, clock generator 102; and clock synthesizer 103. In some embodiments, feedback linear oscillator 101 comprises feedback network 101a and signal amplification circuitry 101b. In some embodiments, clock generator 102 comprises signal conditioning circuitry 102a and analog-to-digital converter (ADC) 102b. In some embodiments, clock synthesizer 103 includes a phase locked loop (PLL).

In some embodiments, feedback network 101a comprises a crystal coupled to one end of a pair of transmission lines and a far-end crystal load capacitor coupled to another end of one of the transmission lines of the pair. For example, a far-end crystal load capacitor is coupled to one of the transmission lines represented by 101c. In some embodiments, the far-end crystal load capacitor is coupled to an output signal path of the crystal.

In some embodiments, another near-end crystal input resonating capacitor is added at an input signal path of the crystal. In some embodiments, the length of the pair of transmission lines is shorter than a critical length which corresponds to an operating frequency (fxo) of the crystal. As such, transmission line (or adverse transmission line) behavior is not observed at operating frequency fxo. For example, capacitive load seen from the crystal to the rest of the circuit elements remains the same regardless of near or far end placement of the load capacitor.

In some embodiments, amplification circuitry 101b comprises an inverting amplifier. Any suitable inverting amplifier can be used to provide the oscillation in the feedback linear oscillator 101. In some embodiments, feedback network 101a is positioned on a platform (e.g., a printed circuit board) while amplification circuitry 101b is part of a chip (e.g., on a silicon), where 101c is the interconnect (or pair or interconnects) coupling feedback network 101a with amplification circuitry 101b.

In some embodiments, an input 101d from the amplification circuitry 101b is an oscillating signal which is received by signal conditioning circuitry 102a. In some embodiments, signal conditioning circuitry 102a is a bandpass filter. In some embodiments, the bandpass filter has a first stage which is a high-pass filter and a second stage which is a low pass filter. In some embodiments, the high-pass filter and the low pass filter are coupled together via AC coupling capacitors. As such, the transfer function of the XO wideband architecture is shaped into a narrow passband with a lower cut-off frequency (e.g., at 10 Mhz −20 dB/decade roll-off) and an upper cut-off frequency (e.g., at 100 Mhz −40 dB/decade roll-off). In some embodiments, the load capacitance seen by the crystal of feedback network 101a is maintained by the placement of the high pass and low pass filters of signal conditioning circuitry 102a.

In some embodiments, the output of signal conditioning circuitry 102a is received by ADC 102b which converts the analog sinusoidal signal into a digital representation (e.g., a digital clock). Any suitable ADC converter may be used to implement ADC 102b. In some embodiments, the output of ADC 102b is a stable clock with very little to no jitter, and can be used as a reference clock (RefClk) or system clock for clock synthesizer 103. In some embodiments, clock synthesizer 103 can be any known PLL that uses the RefClk and generates a PLL clock (PLLClk) for other logics in the processor or chip. In some embodiments, signal amplification circuitry 101b, clock generator 102, and clock synthesizer 103 are implemented or fabricated on die.

Figure 2:
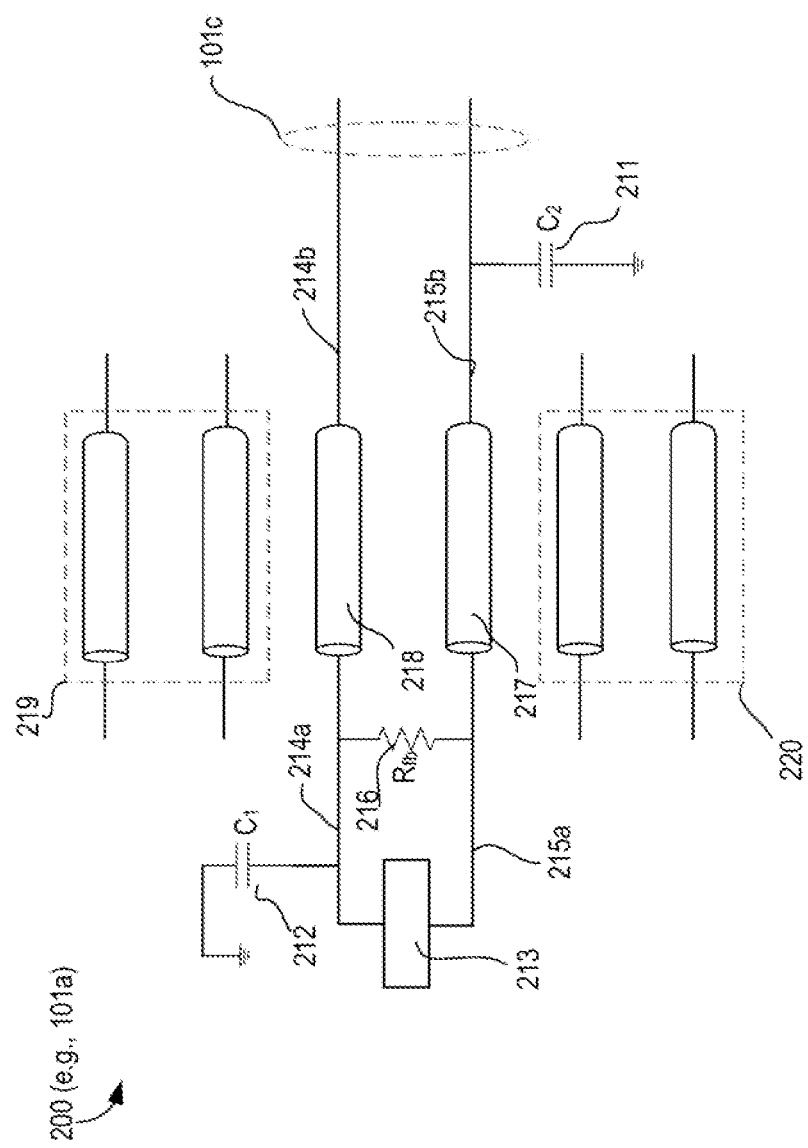
FIG. 2 illustrates a feedback network of an oscillator of the bandpass XO architecture, according to some embodiments of the disclosure.

FIG. 2 illustrates feedback network 200 (e.g., 101a) of an oscillator of the bandpass XO architecture 100, according to some embodiments of the disclosure. It is pointed out that those elements of FIG. 2 having the same reference numbers (or names) as the elements of any other figure can operate or function in any manner similar to that described, but are not limited to such.

In some embodiments, feedback network 200 comprises far-end load capacitor $C_2$ 211, near-end input capacitor $C_1$ 212, crystal 213, crystal input node 214a, crystal output node 215, resistor $R_{fb}$ 216, first interconnect 217, second interconnect 218, feedback network nodes 214b and 216b, coupled together as shown. In some embodiments, other aggressor interconnects are near XO interconnects 217 and 218. For example, interconnects 219 and 220 are near XO interconnects 217 and 218, and these aggressor interconnects tend to induce noise on signals in XO interconnects 217 and 218.

To enhance the noise immunity with minimum overhead in terms of cost, power and performance, the basic principle is to desensitize the XO interconnection by transforming a typical wideband XO architecture into a bandpass architecture. For example, merely the crystal sinusoidal signal is allowed to pass through, while still maintaining the effective crystal loading (here referred to as crystal load capacitance (CLOAD) and equivalent series resistance (ESR)). In various embodiments, the design complexity of architecture 100 is reduced over traditional XO architecture by the placement of the far-end crystal load capacitor ($C_2$), by keeping XO interconnect length (e.g., length of interconnect 217 and 218) within a critical length, and by on-die bandpass filter.

In some embodiments, traditional near-end capacitor (not shown) is detached from node 215a and connected to the far-end node 215b coupled to interconnect 217 or at the input of the signal amplifying circuits 101b to provide an inherent/free first-stage noise filtering mechanism to the sinusoidal signal generated from the feedback linear oscillator 101 before being fed and converted into clock pulses by the clock generator 102. In this case, crosstalk transmission coefficient is effectively being transformed into a low pass function as described with reference to FIG. 7.

Referring back to FIG. 2, the pair of crystal load capacitors $C_2$ 211 and $C_1$ 212 function as a frequency selective filter, which decide the oscillation frequency of feedback linear oscillator 101. In some embodiments, resistor $R_{fb}$ 216 is provided which is a feedback biasing resistor that connects nodes 214a and 215a (e.g., the effective input and output of signal amplifying circuitry 101b to ensure that it operates in its linear region to achieve high open loop gain for oscillation startup). In some embodiments, interconnects 217 and 218 are channels that connect signal amplifying circuitry 101b and crystal 213 to complete the feedback network and establish a positive feedback loop. As such, Barkhausen conditions are fulfilled to produce a stable sinusoidal oscillation which is then fed into clock generating circuitry 102.

Figure 7:
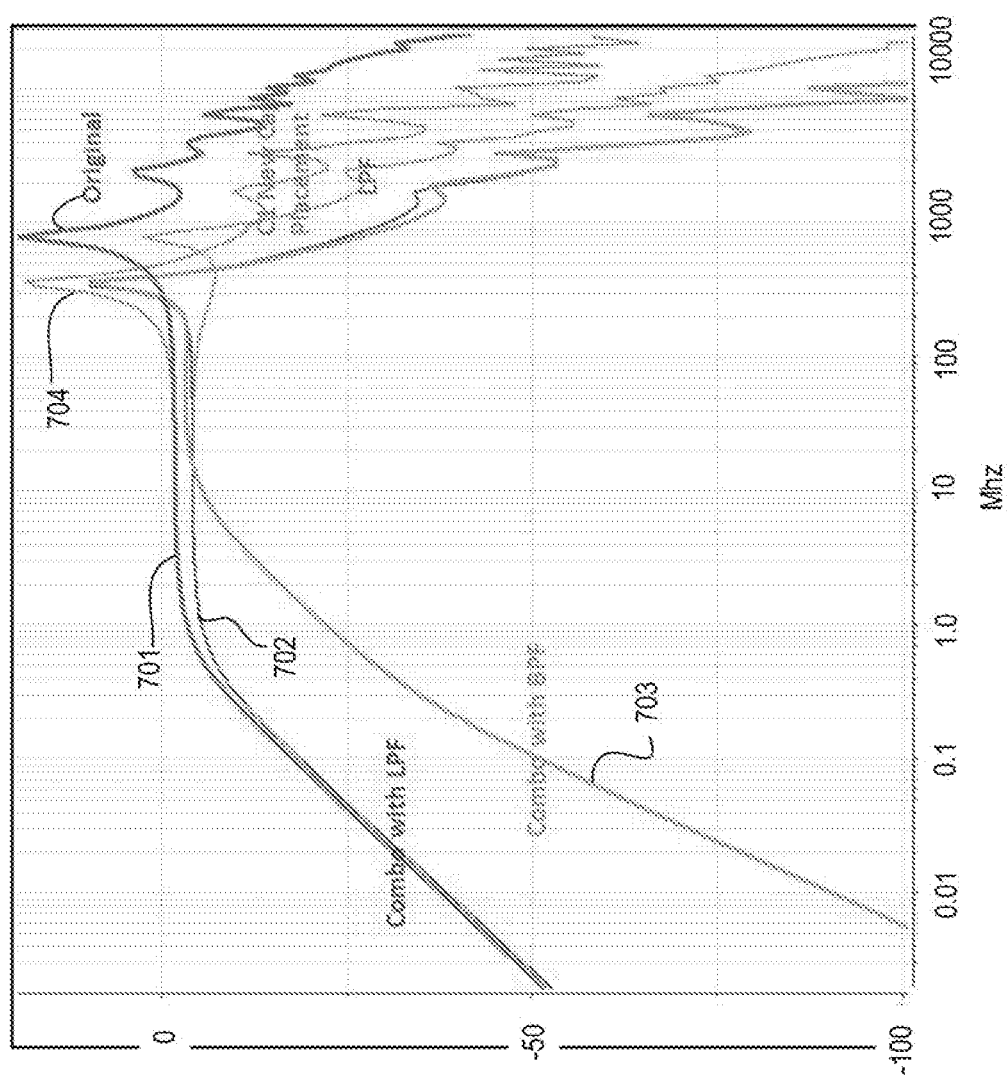
FIG. 7 illustrates a bandwidth plot for various configuration of the bandpass XO architecture.

In some embodiments, the sinusoidal signal through interconnect 217 undergoes the disclosed first stage noise filtering before it is being fed into the clock generating circuitry 102, through the far-end crystal load capacitor $C_2$ 211. In some embodiments, far-end crystal load capacitor $C_2$ 211 functions as the load capacitance for the crystal resonator, and also serves as a first order low pass filter effectively transforming the crosstalk transmission coefficient into a low pass function. For example, far-end crystal load capacitor $C_2$ 211 has a −3 dB cut-off frequency of 600 MHz at −20 dB/decade roll-off as shown in FIG. 7.

Referring back to FIG. 2, in some embodiments, far-end crystal load capacitor $C_2$ 211 is positioned or placed on-board, on-package, or fabricated on-die. In some embodiments, far-end crystal load capacitor $C_2$ 211 is distributed. For example, far-end crystal load capacitor $C_2$ 211 splits into two capacitors, such that one of the capacitor is on-board and the other capacitor is on-package/on-die, where the on-board capacitor provides the flexibility to fine tune the desire effective loading capacitance. Here, the term "split" generally refers to dividing a component into different sections which may be equal in size or unequal in size. The different sections may be placed in a same region or different regions. The on-die portion of far-end crystal load capacitor $C_2$ 211 can be implemented using a transistor, metal mesh, and or a combination of both. The off-die or on-package/board portion of far-end crystal load capacitor $C_2$ 211 can be implemented as a discrete capacitor, a transistor, metal mesh, and or a combination of them.

In some embodiments, the length of XO interconnect 217 and 218 are kept shorter than the critical length which corresponds to the crystal operating frequency (fxo) so that apparently XO interconnect 217 and 218 are not a transmission line at $f_{xo}$. For example, the CLOAD seen from the crystal 213 into the rest of the circuit remains the same regardless of near or far end placement of capacitor $C_2$ 211 placement to maintain the crystal loading.

Figure 3:
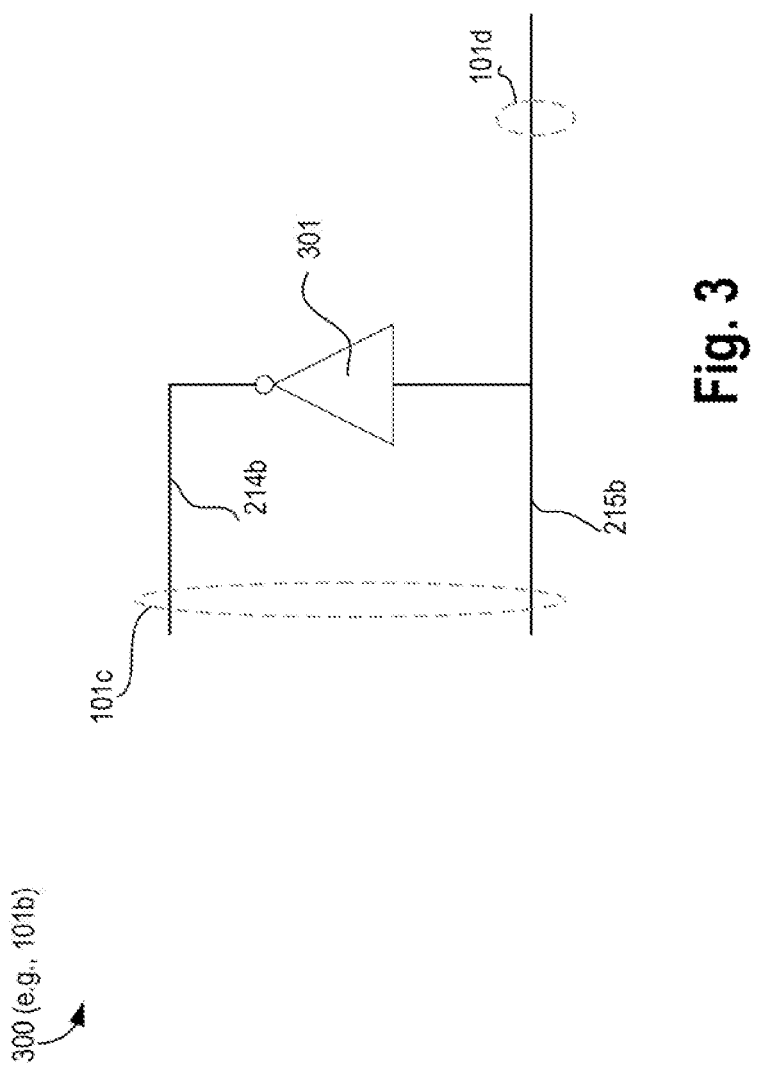
FIG. 3 illustrates a signal amplifier of the bandpass XO architecture, according to some embodiments of the disclosure.

FIG. 3 illustrates signal amplifying circuitry 300 (e.g., 101b) of the bandpass architecture 100, according to some embodiments of the disclosure. It is pointed out that those elements of FIG. 3 having the same reference numbers (or names) as the elements of any other figure can operate or function in any manner similar to that described, but are not limited to such. In some embodiments, signal amplifying circuitry 300 comprises inverting amplifier 301 having an input coupled to node 215b and an output coupled to node 214b. Any suitable architecture of an amplifier can be used for implementing inverting amplifier 301. In various embodiments, inverting amplifier 301 creates sufficient gain and transconductance, Gm, such that Gm is greater than 5 $Gm_{crit}$, where $Gm_{crit}$ is the critical Gm needed for startup. In some embodiments, a negative resistance, −Rn is created to compensate the loss introduced by the ESR from the quartz crystal resonator 213. In some embodiments, the input node 215b (also referred to as node 101d) is coupled to signal conditioning circuitry 102.

Figure 4:
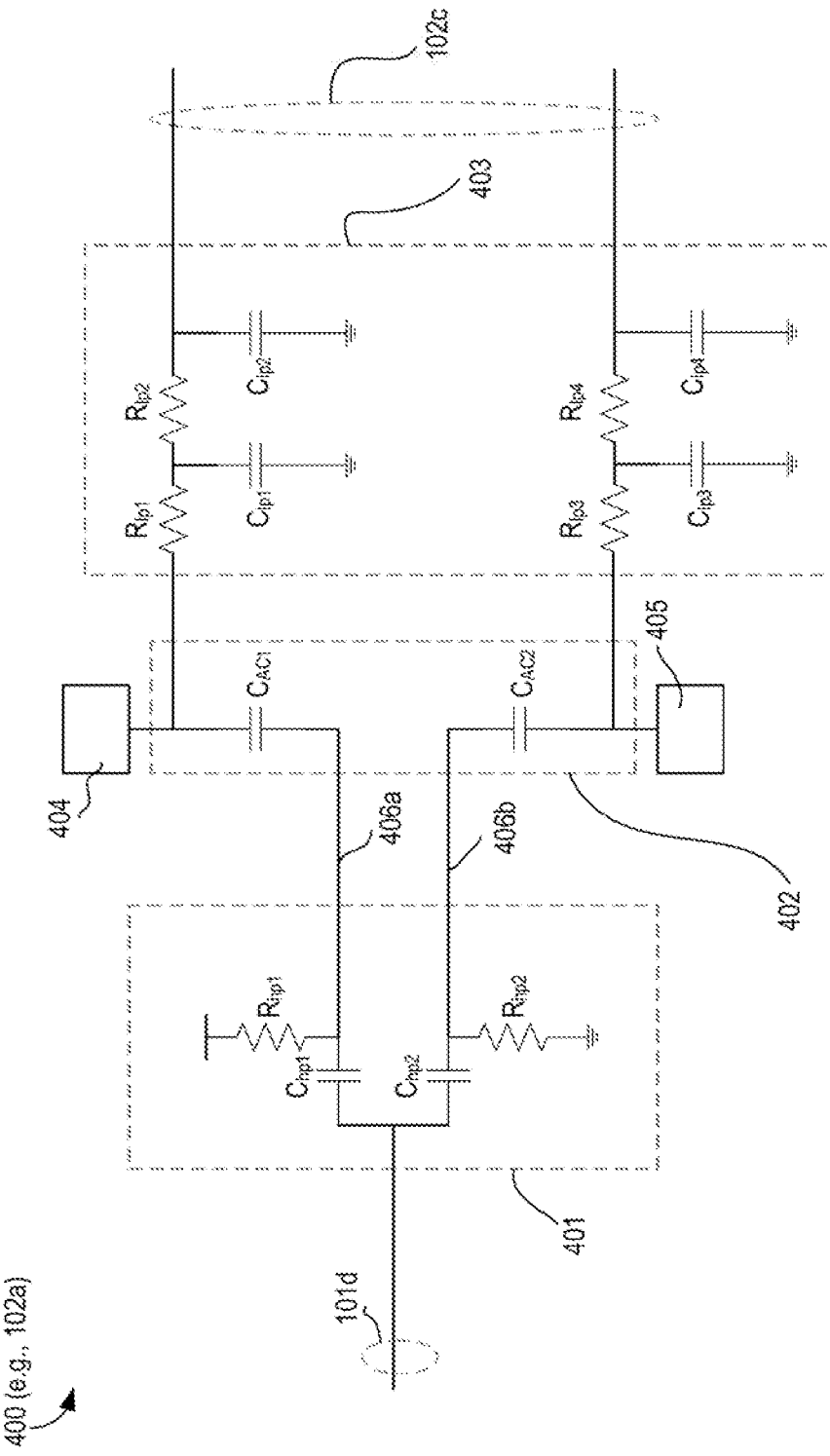
FIG. 4 illustrates a signal conditioning circuitry of the bandpass XO architecture, according to some embodiments of the disclosure.

FIG. 4 illustrates signal conditioning circuitry 400 (e.g., 102a) of the bandpass XO architecture 100, according to some embodiments of the disclosure. It is pointed out that those elements of FIG. 4 having the same reference numbers (or names) as the elements of any other figure can operate or function in any manner similar to that described, but are not limited to such.

In some embodiments, signal conditioning circuitry 400 comprises high-pass filter 401, AC coupling capacitors 402, low pass filter 403, first bias DC generator 404 (e.g., p-bias generator), and second bias DC generator 405 (e.g., n-bias generator) coupled together as shown. In some embodiments, high-pass filter 401 is a first order filter which comprises capacitors $C_{hp1}$ and $C_{hp2}$, and resistor $R_{hp1}$ and $R_{hp2}$ coupled together as shown. However, the embodiments are not limited to a first order filter. For example, higher order high pass filters may be used for implementing high-pass filter 401 in accordance with some embodiments. In some embodiments, resistor $R_{hp1}$ is coupled to a supply node and node 406a. In some embodiments, resistor $R_{hp2}$ is coupled to a ground node and node 406b. In some embodiments, capacitor $C_{hp1}$ is coupled to node 101d and node 406a. In some embodiments, capacitor $C_{hp2}$ is coupled to node 101d and node 406b.

In some embodiments, capacitors $C_{hp1}$ and $C_{hp2}$ can be implemented using discrete capacitor, a transistor, metal mesh, and or a combination of any of them. In some embodiments, resistors $R_{hp1}$ and $R_{hp2}$ can be implemented as transistors operating in linear region or any suitable material used for forming resistors. In some embodiments, high-pass filter 401 generates a differential output on nodes 406a and 406b which couple to AC coupling capacitors 402. The configuration of capacitors $C_{hp1}$ and $C_{hp2}$, and resistor $R_{hp1}$ and $R_{hp2}$ ensures that the RC values for both differential branches (e.g., p-side and n-side) are equalized such that the RC delay and the cut off frequency are exactly matched, in accordance with some embodiments.

In some examples, the first stage low pass filtering mechanism in feedback linear oscillator 101 may be limited to the capacitance value of the far-end capacitor $C_2$ 211, which is usually around 18 pF (pico-Farad) to 22 pF. In some embodiments, the second stage filtering of clock generating circuitry 102 further enhances the filtering effectiveness, by augmenting signal conditioning circuitry 102a with high-pass filter 401 placed before AC coupling capacitors 402, and another low-pass filter 403 placed in between the AC coupling capacitors 402 and ADC 102b. As such, the transfer function is effectively shaped into a narrow passband with a lower cut-off frequency (e.g., at 10 MHz −20 dB/decade roll-off) and an upper cut-off frequency (e.g., at 100 MHz −40 dB/decade roll-off).

In some embodiments, the CLOAD seen from crystal 213 into the rest of the circuit and the ESR of the feedback network 101a are maintained with this unique placement of the high pass filter 401 and low pass filter 403 circuits. In some embodiments, both of these filters merely use passive components. In various embodiments, such scheme empowers the enhancement of noise immunity level without any significant impact on XO performance, cost, and power.

In some embodiments, the sinusoidal signal that passes through the RC high pass filter 401 creates its own DC level of either Vcc for the upper branch or Vss for the lower branch, where Vcc is the power supply and Vss is the ground supply. Under these circumstances, the DC levels are repositioned again before being provided to ADC 102b (e.g., comparator of ADC 102b). In various embodiments, the RC high pass filter 401 is positioned first in the signal path followed by the AC coupling capacitors 402 and DC bias generators 404 and 405. In some embodiments, placing the RC high pass filter 401 before the inverting amplifier 301 may jeopardize the startup behavior of the XO.

In some embodiments, AC coupling capacitors 402 provide electrical isolations from signal amplification circuitry 101b and block the DC components of the signal. This in turn blocks low frequency noises and serves as a high pass filter. In some embodiments, pbias DC generator 404 and nbias DC generator 405 create DC levels and repositions the sinusoidal signals on both branches for the analog to digital conversion by ADC 102b.

In some embodiments, RC low pass filter 403 comprises of resistors $R_{lp1}$, $R_{lp2}$, $R_{lp3}$, and $R_{lp4}$, and capacitors $C_{lp1}$, $C_{lp2}$, $C_{lp3}$, and $C_{lp4}$, coupled together as shown. In some embodiments, RC low pass filter 403 is a second order filter. However, the embodiments are not limited to a second order filter, any other order filter may also be used. In some embodiments, capacitors $C_{lp1}$, $C_{lp2}$, $C_{lp3}$, and $C_{lp4}$ can be implemented using discrete capacitor, a transistor, metal mesh, and or a combination of any of them. In some embodiments, resistors $R_{lp1}$, $R_{lp2}$, $R_{lp3}$, and $R_{lp4}$ can be implemented as transistors operating in their linear regions or any suitable material used for forming resistors. In some embodiments, resistors $R_{lp1}$, $R_{lp2}$, $R_{lp3}$, and $R_{lp4}$ and capacitors $C_{lp1}$, $C_{lp2}$, $C_{lp3}$, and $C_{lp4}$ of the low pass filter 403 are positioned or configured so that they do not create additional loads that may degrade the behavior of the startup conditions and the clock frequency.

With this constraint, in some embodiments, RC low pass filter 403 is placed between the AC coupling capacitors 402 and the comparator of ADC 102b, so that the filtering takes place right before the signal is converted into clock pulses and the resistors $R_{lp1}$, $R_{lp2}$, $R_{lp3}$, and $R_{lp4}$ and capacitors $C_{lp1}$, $C_{lp2}$, $C_{lp3}$, and $C_{lp4}$ are isolated from inverting amplifier 301 through the AC coupling capacitors 402. In some embodiments, any high frequency supply/ground noise propagating through the DC bias generators 404 and 405 can be filtered as well.

Figure 5:
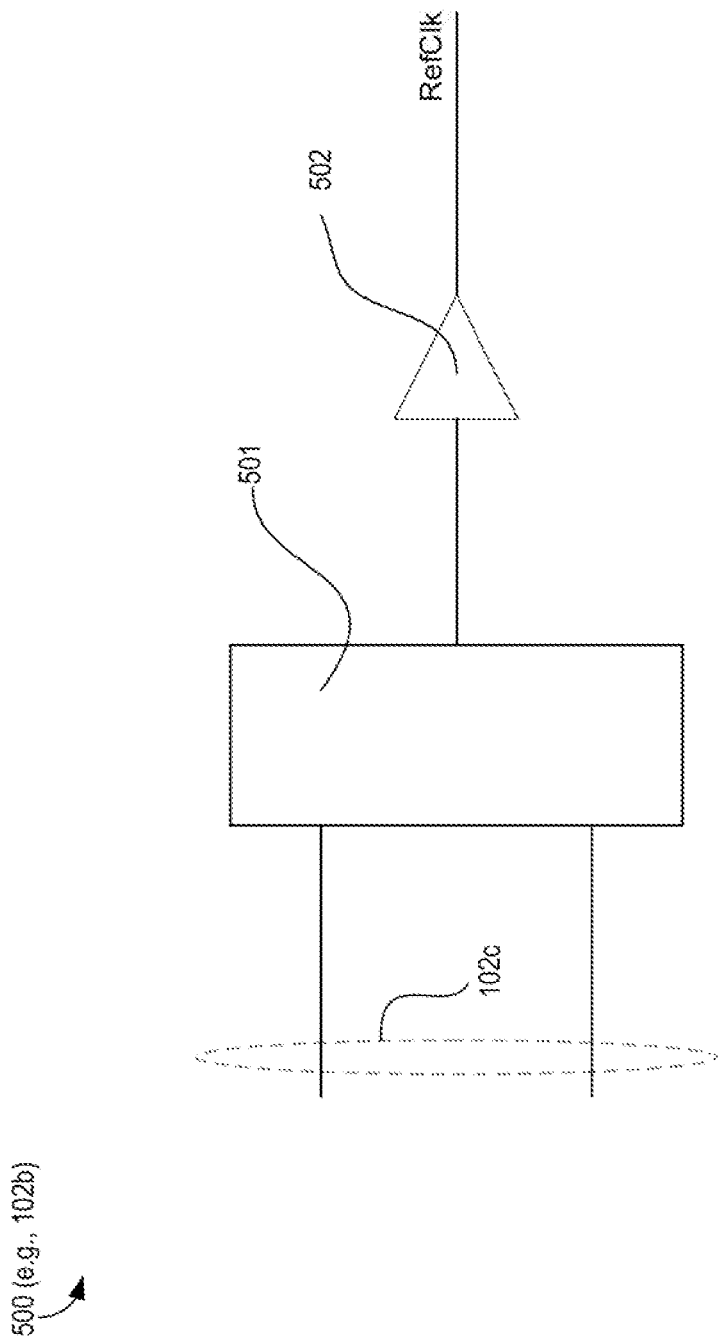
FIG. 5 illustrates an analog-to-digital converter (ADC) of the bandpass XO architecture, according to some embodiments of the disclosure.

FIG. 5 illustrates ADC 500 (e.g., 102b) of the bandpass XO architecture, according to some embodiments of the disclosure. It is pointed out that those elements of FIG. 5 having the same reference numbers (or names) as the elements of any other figure can operate or function in any manner similar to that described, but are not limited to such.

In some embodiments, ADC 500 comprises comparator 501 and buffer 502. In some embodiments, the sinusoidal signal generated from feedback linear oscillator 101 is AC-coupled and filtered before being fed into comparator 501. In some embodiments, comparator 501 triggers when the signal crosses a biasing threshold to produce precise low jitter clock pulses with 50% duty cycle. While ADC 500 is implemented using a comparator 501, other implementations for ADC 500 may also be used.

Compared to traditional XO architecture, the crystal oscillator architecture 100 of various embodiments reduces greater than, for example, 40% of the output clock jitter contributed by the platform noise coupled onto the XO input channel for noise frequency from as low as less than 10 MHz to as high as greater than 50 MHz, with minimum overhead in terms of cost, power and performance (e.g., less than 0.1% growth in die footprint, less than 0.1% increase in current, less than 1% duty cycle shift, and less than 0.1% build-up time increase).

Figure 6:
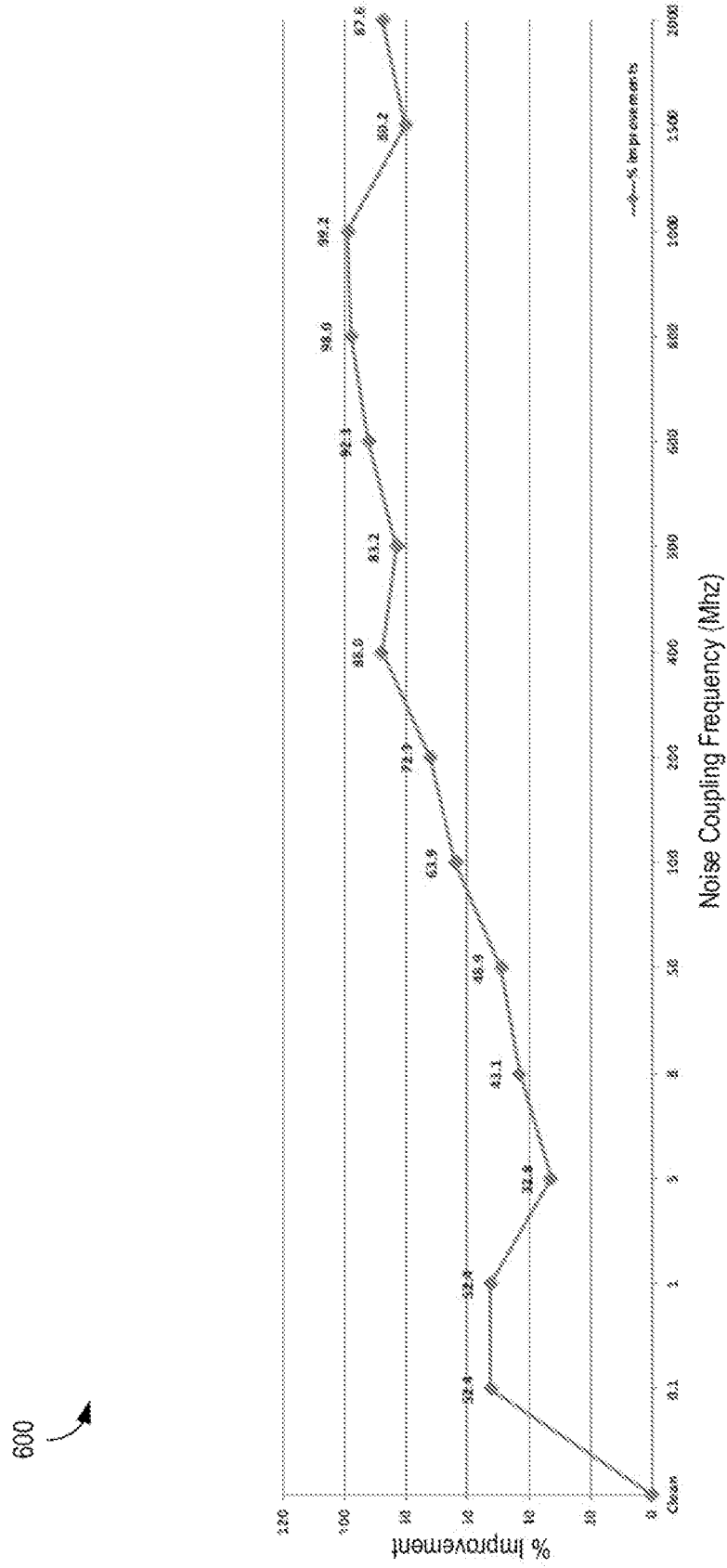
FIG. 6 illustrates a plot showing improvement in jitter by the bandpass XO architecture, according to some embodiments of the disclosure.

FIG. 6 illustrates plot 600 showing improvement in jitter by the bandpass XO architecture, according to some embodiments of the disclosure. It is pointed out that those elements of FIG. 6 having the same reference numbers (or names) as the elements of any other figure can operate or function in any manner similar to that described, but are not limited to such. Here, x-axis is frequency in MHz (megaHertz) and y-axis is jitter improvement in percentage over traditional XO architecture. For various noise coupling frequencies, the XO architecture 100 of various embodiments shows a significant improvement in jitter reduction.

FIG. 7 illustrates bandwidth plot 700 for various configuration of the wideband XO architecture. It is pointed out that those elements of FIG. 7 having the same reference numbers (or names) as the elements of any other figure can operate or function in any manner similar to that described, but are not limited to such. Here, x-axis is frequency in MHz and y-axis is magnitude. Plot 700 shows four waveforms 701, 702, 703, and 704. Here, 701 shows the bandwidth of the traditional XO architecture, 702 shows the bandwidth of the XO architecture with the combination of LPF (low pass filter) and far-end load capacitors, 703 shows the bandwidth of the XO architecture with the combination of BPF and far-end load capacitors, 704 shows the bandwidth of the XO architecture with only far-end load capacitors. Here, −3 dB bandwidth is effectively narrowed down to 10 Mhz (lower cut-off frequency at −20 db/decade roll off and 100 MHz (upper cut-off frequency at −40 db/decade roll off and −60 db/decade roll off for higher frequency greater than 500 MHz as compared to a traditional architecture with a wide passband of 500 KHz (lower cut-off frequency) to 3 GHz (upper cut-off frequency).

Figure 8:
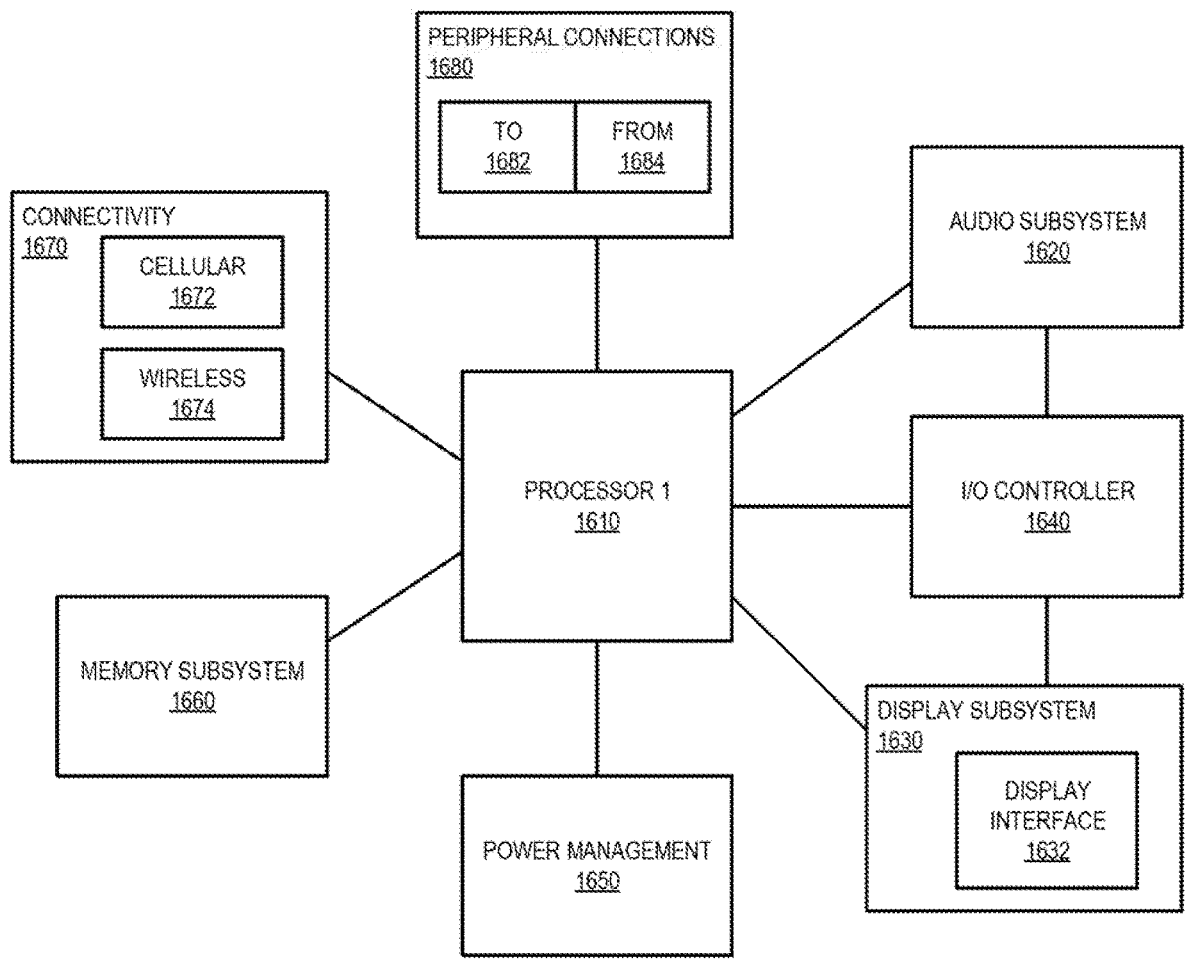
FIG. 8 illustrates a smart device or a computer system or a SoC (System-on-Chip) with or using the bandpass XO architecture, according to some embodiments.

FIG. 8 illustrates a smart device or a computer system or a SoC (System-on-Chip) with or using the bandpass XO architecture, according to some embodiments. It is pointed out that those elements of FIG. 8 having the same reference numbers (or names) as the elements of any other figure can operate or function in any manner similar to that described, but are not limited to such.

FIG. 8 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes first processor 1610 which receives clock generated by the wideband XO architecture, according to some embodiments discussed. Other blocks of the computing device 1600 may also receive clock generated by the bandpass XO architecture, according to some embodiments. The various embodiments of the present disclosure may also comprise a network interface within 1670 such as a wireless interface so that a system embodiment may be incorporated into a wireless device, for example, cell phone or personal digital assistant.

In some embodiments, processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process. Various embodiments here can be can be combined with any of the other embodiments thereby allowing various combinations.

Example 1 is an apparatus which comprise: a crystal having an input and an output; a first interconnect having first and second ends, wherein the first end is coupled to the input; a second interconnect having first and second ends, wherein the first end is coupled to the output; a first capacitor coupled between the input and a ground; and a second capacitor coupled to the second end of the second interconnect.

Example 2 includes all features of example 1, wherein the second capacitor is split between: on-board and on-package; or on-board and on-die.

Example 3 includes all featurs of example 1, wherein the apparatus of example 3 comprises a resistor coupled to the input and output of the crystal.

Example 4 is according to any one of claims 1 to 3, wherein capacitance of the second capacitor is in a range of 18 pF to 22 pF.

Example 5 includes all features of example 1, wherein the first interconnect has a first length, wherein the second interconnect has a second length, wherein the first and second lengths are shorter than a critical length, and wherein the critical length corresponds to an operating frequency of the crystal.

Example 6 includes all features of example 1, wherein the second end of the first interconnect is to receive an output of an inverting amplifier.

Example 7 includes all featurs of example 6, wherein the second end of the second interconnect is to provide an input to the inverting amplifier.

Example 8 includes all features of example 7, wherein the second end of the second interconnect is coupled to a high pass filter.

Example 9 includes all features of example 8, wherein the high pass filter is on die.

Example 10 includes all features of example 9, wherein the high pass filter is coupled to AC coupling capacitors.

Example 11 includes all features of example 10, wherein the AC coupling capacitors are coupled to a low pass filter.

Example 12 includes all features of example 11, wherein the low pass filter is a second order low pass filter.

Example 13 includes all features of example 11, wherein an output of the low pass filter is coupled to an analog to digital converter (ADC).

Example 14 includes all features of example 13, wherein the ADC comprises a comparator and a buffer.

Example 15 includes all features of example 14, wherein an output of the buffer is coupled to a reference clock node of a phase locked loop (PLL).

Example 16 is an apparatus whch comporses: a high pass filter; a pair of AC coupling capacitors coupled to the high pass filter; a low pass filter coupled to the pair of AC coupling capacitors; and an analog to digital converter (ADC) coupled to the low pass filter.

Example 17 includes all features of example 16, wherein the high pass filter is to be coupled to first interconnect line having a first end and a second end.

Example 18 includes all features of example 17, wherein the first end of the first interconnect line is coupled to an output of a crystal.

Example 19 includes all features of example 18, wherein the second end of the first interconnect line is coupled to: the high pass filter and a first capacitor; and an input of an inverting amplifier.

Example 20 includes all features of example 19, wherein a second interconnect line is coupled to an output of the inverting amplifier, wherein the second interconnect line includes a first end and a second end, wherein the first end is coupled to an input of the crystal, and wherein the second end is coupled to an output of the inverting amplifier.

Example 21 includes all features of example 20, wherein the first end of the second interconnect line is coupled to a second capacitor.

Example 22 is a system which comprises: a memory; a processor coupled to the memory; a clock synthesizer having a reference clock node to receive a reference clock; a reference clock generator coupled to the clock synthesizer, wherein the reference clock generator is to provide the reference clock, and wherein the reference clock generator comprises an apparatus which includes any of one example 16 to example 21; and a wireless interface to allow the processor to communicate with another device.

Example 23 includes all features of example 22, wherein the processor is coupled to an oscillator which is positioned off die.

Example 24 includes all features of example 23, wherein the oscillator comprises: a crystal having an input and an output; a first interconnect line having first and second ends, wherein the first end is coupled to the input; a second interconnect line having first and second ends, wherein the first end is coupled to the output; a first capacitor coupled to the input and ground; and a second capacitor coupled to the second end of the second interconnect line.

Example 25 includes all features of example 24, wherein the second capacitor is split between: on-board and on-package; or on-board and on-die.

Example 26 is a method which comprises: generating an osciallting signal; high pass filtering the osciallting signal; AC coupling the high pass filtered osciallting signal; low pass filtering an output of the AC coupling; and converting an output from low pas filtering into a digital signal which is a clock signal.

Example 27 includes all features of example 26, wherein the method of example 27 comprises providng the digital signal as a reference signal to a clock synthesizer.

Example 28 is an apparatus which comprises: means for generating an osciallting signal; means for high pass filtering the osciallting signal; means for AC coupling the high pass filtered osciallting signal; means for low pass filtering an output of the AC coupling; and means for converting an output from low pas filtering into a digital signal which is a clock signal.

Example 29 includes all features of example 28, wherein the apparatus of example 29 comprises: means for providng the digital signal as a reference signal to a clock synthesizer.

Example 30 is a system which comprises: a memory; a processor coupled to the memory; a clock synthesizer having a reference clock node to receive a reference clock; a reference clock generator coupled to the clock synthesizer, wherein the reference clock generator is to provide the reference clock, and wherein the reference clock generator comprises an apparatus which includes any of one example 1 to example 15; and a wireless interface to allow the processor to communicate with another device.

Example 31 is a system which comprises: a memory; a processor coupled to the memory; a clock synthesizer having a reference clock node to receive a reference clock; a reference clock generator coupled to the clock synthesizer, wherein the reference clock generator is to provide the reference clock, and wherein the reference clock generator comprises an apparatus which includes any of one example 28 to example 29; and a wireless interface to allow the processor to communicate with another device.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:
1. An apparatus comprising:
an oscillator;
a near-end capacitor coupled to a first interconnect, wherein the first interconnect is coupled to the oscillator;
a far-end capacitor coupled to a second interconnect, wherein the second interconnect is coupled to the oscillator;
a resistor directly conductively coupled to the first and second interconnects to provide a feedback path, wherein the resistor is closer to the near-end capacitor than the far-end capacitor;
an inverting amplifier coupled to the first and second interconnects; and
a signal conditioning circuitry coupled to the inverting amplifier, wherein the signal conditioning circuitry comprises:
a high pass filter;
a pair of AC coupling capacitors coupled to the high pass filter;
a low pass filter coupled to the pair of AC coupling capacitors; and
an analog to digital converter (ADC) coupled to the low pass filter.

2. The apparatus of claim 1, wherein the oscillator comprises a crystal.

3. The apparatus of claim 1, wherein the inverting amplifier is closer to the far-end capacitor than the near-end capacitor.

4. The apparatus of claim 1, wherein the inverting amplifier has a trans-conductance greater than five times a critical trans-conductance for startup.

5. The apparatus of claim 1, wherein the far-end capacitor has a −3 dB cut-off frequency of around 600 MHz at −20 dB/decade roll-off.

6. The apparatus of claim 1, wherein the first interconnect has a first length, wherein the second interconnect has a second length, wherein the first and second lengths are shorter than a critical length, and wherein the critical length corresponds to an operating frequency of the oscillator.

7. The apparatus of claim 1, wherein an output of the ADC is a clock.

8. The apparatus of claim 1, wherein an output of the ADC is a reference clock which is received directly or indirectly by a phase locked loop (PLL).

9. A system comprising:
a memory;
a processor coupled to the memory;
a wireless interface to allow the processor to communicate with another device;
a clock synthesizer having a reference clock node to receive a reference clock; and
a reference clock generator coupled to the clock synthesizer, wherein the reference clock generator is to provide the reference clock, and wherein the reference clock generator is coupled to:
  a near-end capacitor coupled to a first interconnect, wherein the first interconnect is coupled to an oscillator;
  a far-end capacitor coupled to a second interconnect, wherein the second interconnect is coupled to the oscillator;
  a resistor directly conductively coupled to the first and second interconnects to provide a feedback path;
  an inverting amplifier coupled to the first and second interconnects; and
  a signal conditioning circuitry coupled to the inverting amplifier, wherein the signal conditioning circuitry comprises:
    a high pass filter;
    a pair of AC coupling capacitors coupled to the high pass filter;
    a low pass filter coupled to the pair of AC coupling capacitors; and
    an analog to digital converter (ADC) coupled to the low pass filter.

10. The system of claim 9, wherein the processor is coupled to the oscillator which is positioned off die.

11. The system of claim 9, wherein the first interconnect has a first length, wherein the second interconnect has a second length, wherein the first and second lengths are shorter than a critical length, and wherein the critical length corresponds to an operating frequency of the oscillator.

12. The system of claim 9, wherein the resistor is closer to the near-end capacitor than the far-end capacitor.

13. The system of claim 9, wherein the oscillator comprises a crystal.

14. The system of claim 9 wherein the first and second interconnects are coupled to an inverting amplifier.

15. An apparatus comprising:
a phase locked loop to receive a reference clock;
an analog-to-digital converter (ADC) to generate the reference clock; and
a filter coupled to the ADC, wherein the filter includes a high-pass filter and a low-pass filter coupled to the high-pass-filter, wherein the filter is coupled to:
  a first interconnect, wherein the first interconnect is coupled to an oscillator and a near-end capacitor; and
  a second interconnect, wherein the second interconnect is coupled to the oscillator and a far-end capacitor, wherein a resistor coupled to the first and second interconnects.

16. The apparatus of claim 15, wherein:
the resistor is closer to the near-end capacitor than the far-end capacitor; the oscillator comprises a crystal; and
the first and second interconnects are coupled to an inverting amplifier, wherein the inverting amplifier is close to the far-end capacitor than the near-end capacitor.

17. The apparatus of claim 15, wherein the far-end capacitor has a −3 dB cut-off frequency of around 600 MHz at −20 dB/decade roll-off.

* * * * *